US009102118B2

(12) United States Patent  (10) Patent No.: US 9,102,118 B2
Afzali-Ardakani et al.  (45) Date of Patent: Aug. 11, 2015

(54) FORMING PATTERNED GRAPHENE LAYERS

(75) Inventors: Ali Afzali-Ardakani, Ossining, NY (US); Ahmed Maarouf, Mohegan Lake, NY (US); Glenn J. Martyna, Croton on Hudson, NY (US); Katherine Saenger, Ossining, NY (US)

(73) Assignees: International Business Machines Corporation, Armonk, NY (US); Egypt Nanotechnology Center (EGNC), Cairo (EG)

( * ) Notice: Subject to any disclaimer, the term of this patent is extended or adjusted under 35 U.S.C. 154(b) by 918 days.

(21) Appl. No.: 13/310,885

(22) Filed: Dec. 5, 2011

(65) Prior Publication Data

US 2013/0143000 A1  Jun. 6, 2013

(51) Int. Cl.
*B82Y 30/00* (2011.01)
*B82Y 40/00* (2011.01)
*B32B 3/00* (2006.01)
*C01B 31/02* (2006.01)
*C23F 1/02* (2006.01)
*H01B 13/00* (2006.01)
*C01B 31/04* (2006.01)

(52) U.S. Cl.
CPC . *B32B 3/00* (2013.01); *B82Y 30/00* (2013.01); *B82Y 40/00* (2013.01); *C01B 31/0446* (2013.01); *C23F 1/02* (2013.01); *H01B 13/00* (2013.01); *Y10T 428/24545* (2015.01)

(58) Field of Classification Search
None
See application file for complete search history.

(56) References Cited

U.S. PATENT DOCUMENTS

| 6,890,624 | B1 | 5/2005 | Kambe et al. | |
| 8,927,057 | B2* | 1/2015 | Bol et al. | 427/227 |
| 2010/0032409 | A1 | 2/2010 | Hong et al. | |
| 2010/0218801 | A1 | 9/2010 | Sung et al. | |
| 2010/0323164 | A1 | 12/2010 | Olihara et al. | |
| 2011/0049132 | A1 | 3/2011 | Lee | |
| 2011/0104442 | A1 | 5/2011 | Yoon et al. | |
| 2011/0201201 | A1* | 8/2011 | Arnold et al. | 438/694 |
| 2013/0099194 | A1* | 4/2013 | Maliakal | 257/9 |
| 2014/0120270 | A1* | 5/2014 | Tour et al. | 427/596 |

(Continued)

OTHER PUBLICATIONS

Liu et al. Doped Graphene Nanohole Arrays for Flexible Transparent Conductors, Applied Physics Letters 99, 023111 (2011) pp. 1-3.

(Continued)

*Primary Examiner* — Anita Alanko
(74) *Attorney, Agent, or Firm* — Ryan, Mason & Lewis, LLP

(57) ABSTRACT

An apparatus and method for forming a patterned graphene layer on a substrate. One such method includes forming at least one patterned structure of a carbide-forming metal or metal-containing alloy on a substrate, applying a layer of graphene on top of the at least one patterned structure of a carbide-forming metal or metal-containing alloy on the substrate, heating the layer of graphene on top of the at least one patterned structure of a carbide-forming metal or metal-containing alloy in an environment to remove graphene regions proximate to the at least one patterned structure of a carbide-forming metal or metal-containing alloy, and removing the at least one patterned structure of a carbide-forming metal or metal-containing alloy to produce a patterned graphene layer on the substrate, wherein the patterned graphene layer on the substrate provides carrier mobility for electronic devices.

23 Claims, 5 Drawing Sheets

(56) References Cited

U.S. PATENT DOCUMENTS

2014/0141581 A1* 5/2014 Sato et al. .................. 438/197
2015/0014600 A1* 1/2015 Jeon et al. .................. 252/502

OTHER PUBLICATIONS

Bai et al., Graphene Nanomesh, Nat. Nanotechnol. Mar. 2010; 5(3):190-194, pp. 1-10.

Lahiri et al., Graphene Destruction by Metal-Carbide Formation: An Approach for Patterning of Metal-Supported Graphene, Applied Physics Letters 97, 023102 (2010) pp. 1-3.

Lahiri et al., Graphene Growth and Stability at Nickel Surfaces, New Journal of Physics 13(2011) 025001, pp. 1-20.

Ci et al., Controlling Nanocutting of Graphene, Nano Res (2008)1:116-122.

Lin et al., Rapid Self-Assembly of Ni Nanodots on Si Substrate Covered by a Less-Adhesive and Heat-Accumulated SiO2 Layers, Applied Physics Letters 89, 073108 (2006) pp. 1-3.

Levchenko et al., Plasma-Driven Self-Organization of Ni Nanodot Arrays on Si(100), Applied Physics Letters 93, 183102 (2008) pp. 1-3.

* cited by examiner

FORMING PATTERNED GRAPHENE LAYERS

FIELD OF THE INVENTION

Embodiments of the invention generally relate to electronic devices and, more particularly, to nanoscale-patterned graphene.

BACKGROUND OF THE INVENTION

The exceptionally high intrinsic carrier mobility of graphene makes it a potentially promising material for high frequency electronic devices such as, for example, low-noise amplifiers for communication applications. However, there are many applications for nanoscale forms of carbon in which a graphene nanomesh (GNM) might be preferable to a continuous layer of graphene.

GNM may be intrinsically semiconducting with a non-zero gap (unlike graphene that has a zero gap with a vanishing density of states (DOS)), or quasi-metallic like graphene, with a vanishing DOS at the Fermi energy. Existing methods for nanomesh patterning of graphene, however, have drawbacks.

For example, existing approaches are not scalable to large areas. Additionally, in some existing approaches, graphene may be degraded by the deposition and removal of the masking materials used. A drawback of an existing approach in which graphene on a carbide-forming metal (M) layer is patterned by carbide-forming reactions with overlying metal nanodots is the narrow process window for graphene patterning versus graphene re-growth, a consequence of the fact that graphene removal by a carbide formation reaction with the nanodot is reversible via a mechanism in which the metal/metal carbide nanodot migrates into and merges with the M support layer, leaving behind a "healed" graphene surface reformed with carbon released from the nanodot.

Other existing approaches, such as those utilizing mobile metal nanodots for patterning, have disadvantages related to a lack of a means to control the nanodot trajectories (and the patterns of removed graphene left in their wake).

Accordingly, given the disadvantages of the existing approaches, there is a need for improved methods for nanoscale patterning of graphene.

SUMMARY OF THE INVENTION

In one aspect of the invention, a method for forming a patterned graphene layer on a substrate is provided. The method includes the steps of forming at least one patterned structure of a carbide-forming metal or metal-containing alloy on a substrate, applying a layer of graphene on top of the at least one patterned structure of a carbide-forming metal or metal-containing alloy on the substrate, heating the layer of graphene on top of the at least one patterned structure of a carbide-forming metal or metal-containing alloy in an environment to remove graphene regions proximate to the at least one patterned structure of a carbide-forming metal or metal-containing alloy, and removing the at least one patterned structure of a carbide-forming metal or metal-containing alloy to produce a patterned graphene layer on the substrate, wherein the patterned graphene layer on the substrate provides carrier mobility for electronic devices.

Another method for forming a patterned graphene layer on a substrate includes applying graphene on top of a substrate to form a layer of graphene on the substrate, forming at least one patterned structure of a carbide-forming metal or metal-containing alloy, heating the layer of graphene in an environment to remove graphene regions proximate to the at least one patterned structure of a carbide-forming metal or metal-containing alloy, and removing the at least one patterned structure of a carbide-forming metal or metal-containing alloy to produce a patterned graphene layer on the substrate, wherein the patterned graphene layer on the substrate provides carrier mobility for electronic devices.

Yet another aspect of the invention includes a graphene nanomesh structure on a substrate, wherein the graphene nanomesh structure provides carrier mobility for electronic devices, and wherein the structure includes a temporary patterned structure of a carbide-forming metal or metal-containing alloy disposed on top of the substrate, and graphene disposed on top of the substrate, wherein the graphene has reacted with the at least one temporary patterned structure of a carbide-forming metal or metal-containing alloy to remove graphene regions proximate to the at least one patterned structure of a carbide-forming metal or metal-containing alloy to produce a graphene nanomesh structure on the substrate.

Also, another aspect of the invention includes a patterned graphene structure on a substrate, wherein the patterned graphene structure provides carrier mobility for electronic devices, and wherein the structure includes a temporary patterned structure of a carbide-forming metal or metal-containing alloy disposed on top of the substrate, and graphene disposed on top of the substrate, wherein the graphene has reacted with the at least one temporary patterned structure of a carbide-forming metal or metal-containing alloy to remove graphene regions proximate to the at least one patterned structure of a carbide-forming metal or metal-containing alloy to produce a patterned graphene layer on the substrate.

These and other objects, features and advantages of the present invention will become apparent from the following detailed description of illustrative embodiments thereof, which is to be read in connection with the accompanying drawings.

DETAILED DESCRIPTION OF EMBODIMENTS

Figure 1:
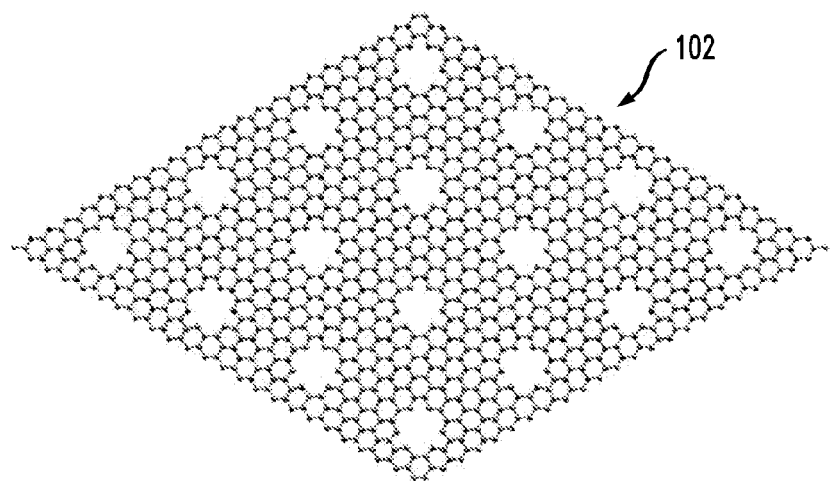
FIG. 1 is a diagram illustrating an example graphene nanomesh (GNM), according to an embodiment of the present invention.

An aspect of the invention includes using metal-induced reactions for nanomesh patterning of graphene. Graphene nanomeshes (GNMs) are carbon based structures that are made by creating holes in a graphene sheet in a periodic way (as illustrated, for example, in FIG. 1). Four geometrical parameters characterize a GNM: the hole lattice, size, shape, and lattice constant.

As described herein, aspects of the invention include multiple related methods for forming a patterned graphene layer on an insulating or copper- (Cu-) based substrate. In addition to copper, embodiments of the invention can include the use of non-carbide forming metals or metal alloys. Each method relies on the fact that regions of graphene in contact with nickel- (Ni-) like materials are unstable at elevated temperatures and easily removed by mechanisms such as metal-catalyzed decomposition into carbon-containing volatiles (typically in a hydrogen-containing environment at elevated temperature) and/or reaction and/or complexation with Ni-like materials to form solublized carbon and/or carbides.

As used herein, Ni-like refers to carbide forming metals or metal alloys. Additionally, as used herein, a mixed material layer refers to a graphene layer plus a patterned layer of a carbide forming metal or metal alloy material.

As detailed herein, embodiments of the present invention include techniques for forming a patterned graphene layer on an insulating substrate wherein patterned structures of Ni-like materials can be formed and/or applied either under or on top of a layer of graphene.

Methods with Ni-like structures under the graphene have the advantages that the positions of the Ni-like structures are fixed (versus mobile) and that there is no chance of Ni-like structure interaction with graphene during the Ni-like structure fabrication because the metal patterning or self-assembly is done before the graphene is on the substrate.

Methods with Ni-like structures over the graphene have the advantages that the patterning can be done on generic graphene wafers (for example, graphene bonded to a carrier substrate), but such Ni-like structures may be mobile and there may be less flexibility in the Ni-like structure fabrication methods when the Ni-like structures are formed on top of a graphene layer. For example, for self-assembled Ni-like structures, a blanket layer of thin Ni on the graphene might react with the graphene before it self-assembled into Ni nanodots.

GNM materials are typically most useful when situated on insulating substrates. When the substrate for the two methods just described is insulating, the patterned graphene can stay in place on the substrate on which it was patterned; GNM on an insulating substrate can thus be formed directly with no need for subsequent transfer to an insulating substrate and/or special handling to remove conductive upper layers of the substrate underlying the GNM.

Patterning of copper- (Cu-) supported graphene (by way of example, graphene on a Cu foil substrate) by Ni-like structures is also contemplated. In this instance, the GNM would typically be transferred to an insulating substrate in a process sequence that might include the steps of bonding the GNM to a temporary support layer, removing the Cu support by a process such as Cu etching to leave a GNM/support layer structure, bonding the GNM to a permanent handle substrate, and removing the temporary support layer. An advantage of this embodiment is that it is compatible with roll-to-roll fabrication methods.

Figure 2:
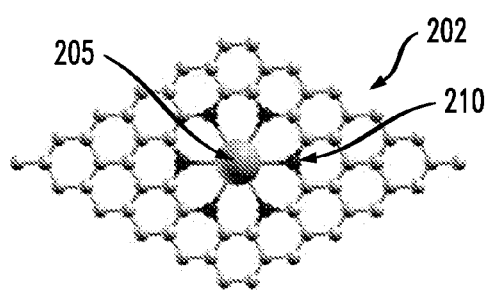
FIG. 2 is a diagram illustrating a passivated and doped graphene nanomesh, according to an embodiment of the present invention.
Figure 3:
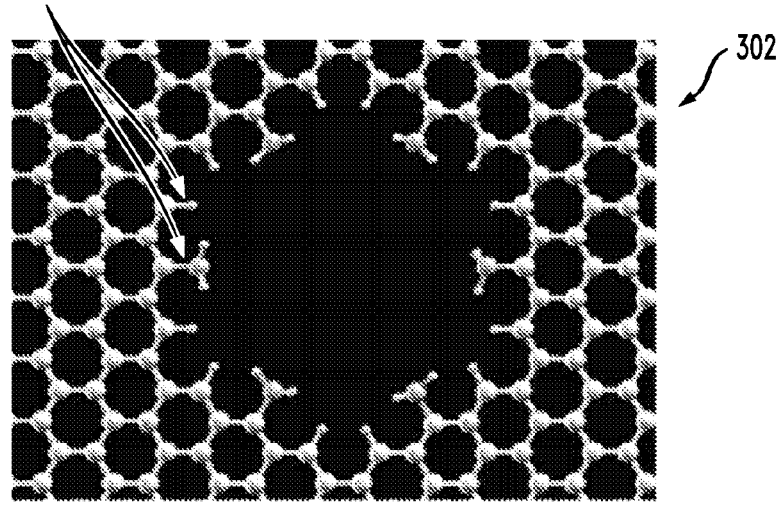
FIG. 3 is a diagram illustrating a functionalized graphene nanomesh, according to an embodiment of the present invention.

FIGS. 1-3 depict graphene nanomesh (GNM) materials that may be functionalized (FIGS. 2-3) or not (FIG. 1). Accordingly, FIG. 1 is a diagram illustrating an example of a non-functionalized graphene nanomesh (GNM) 102, according to an embodiment of the present invention. FIG. 2 is a diagram illustrating a passivated and doped graphene nanomesh 202, with dopant moiety 205 and passivating moieties 210 that may be formed from GNM similar to GNM 102. FIG. 3 is a diagram illustrating a functionalized graphene nanomesh 302, with functionalizing moieties 305 (shown both end-on and in plan view) that may be formed from GNM similar to GNM 102.

Figure 4:
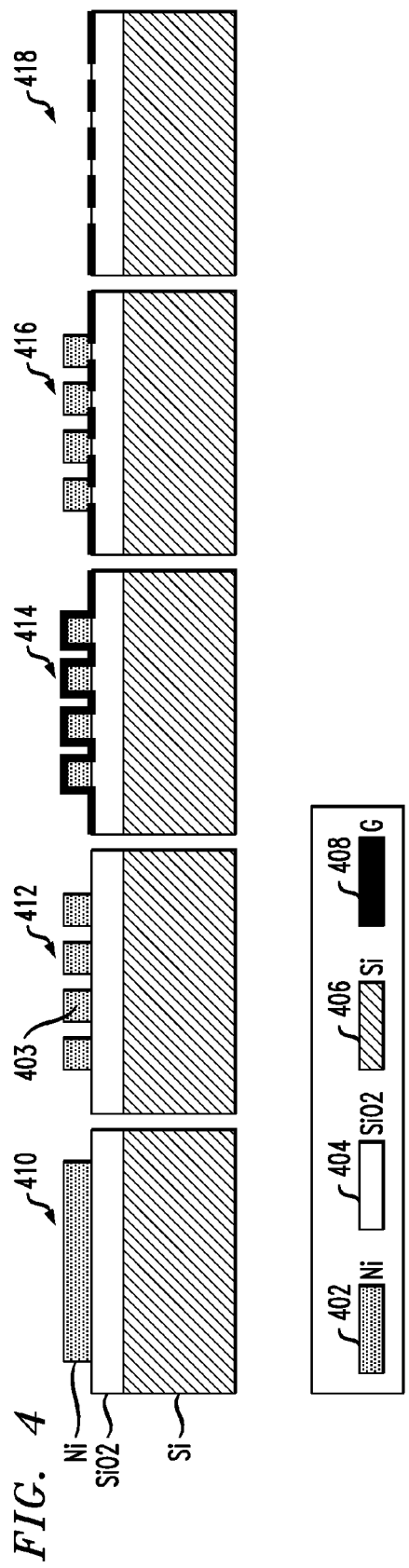
FIG. 4 is a diagram illustrating the "under" technique for forming a patterned graphene layer, according to an embodiment of the present invention.

FIG. 4 is a diagram illustrating the "under" technique for forming a patterned graphene layer, according to an embodiment of the present invention. By way of illustration, in the "under" technique, self-assembled Ni-like structures are formed from a blanket layer of Ni-like material, and the patterned graphene can stay on the substrate. Specifically, the example in FIG. 4 depicts Ni 402, $SiO_2$ 404, Si 406 and graphene (G) 408. Illustrated step 410 includes depositing a thin layer of Ni onto $SiO_2$ (on top of the Si substrate).

Illustrated step 412 includes agglomerating the Ni into self-assembled nanodots to produce patterned Ni structures 403. Illustrated step 414 includes transferring and/or bonding a graphene layer to the Ni nanodot/substrate layer. Illustrated step 416 includes patterning the graphene via a localized reaction with the Ni. Illustrated step 418 includes etching away the Ni, leaving the patterned graphene layer. While steps 410 and 412 of FIG. 4 show patterned Ni structures 403 formed by self-assembly from a blanket thin film (via known processes), this is only one of several methods that may be used to form the patterned Ni structures.

Figure 5:
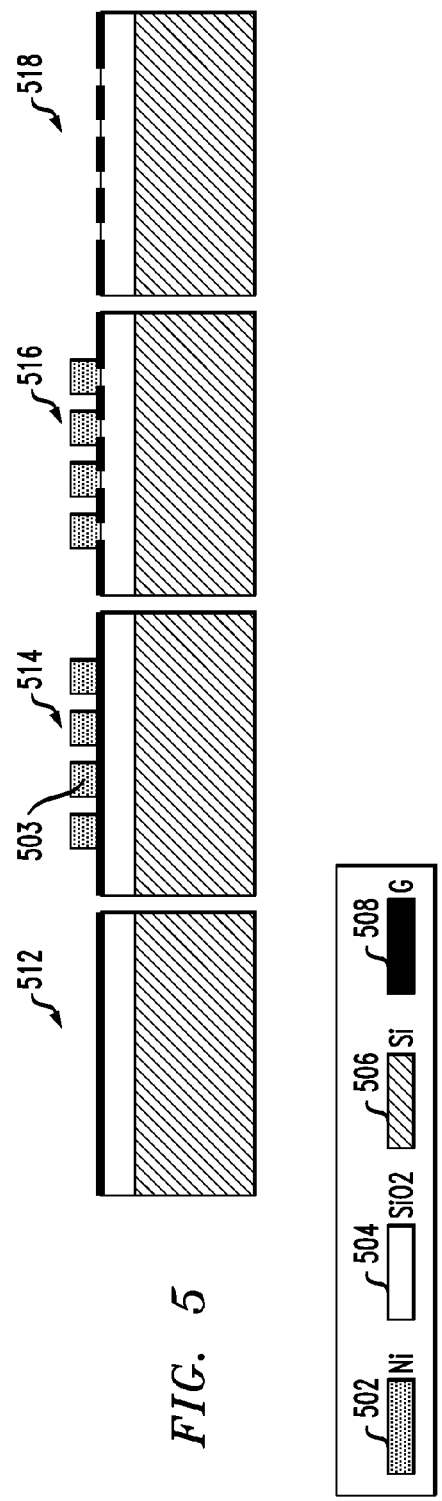
FIG. 5 is a diagram illustrating the "over" technique for forming a patterned graphene layer, according to an embodiment of the present invention.

FIG. 5 is a diagram illustrating the "over" technique for forming a patterned graphene layer, according to an embodiment of the present invention. By way of illustration, in the "over" technique, the Ni-like structures are deposited from a solution, and the patterned graphene can stay on the substrate. Specifically, the example in FIG. 5 depicts Ni 502, $SiO_2$ 504, Si 506 and graphene (G) 508.

Illustrated step 512 includes depositing a layer of graphene onto $SiO_2$ (on top of the Si substrate). Illustrated step 514 includes forming patterned Ni structures 503 by, for example, depositing self-assembling Ni nanodots from solution. Illustrated step 516 includes patterning the graphene via a localized reaction with the Ni. Illustrated step 518 includes etching away the Ni, leaving the patterned graphene layer. While step 512 of FIG. 5 shows patterned Ni structures 503 formed by self-assembling Ni nanodots from solution (via known processes), this is only one of several methods that may be used to form the patterned Ni structures.

Figure 6:
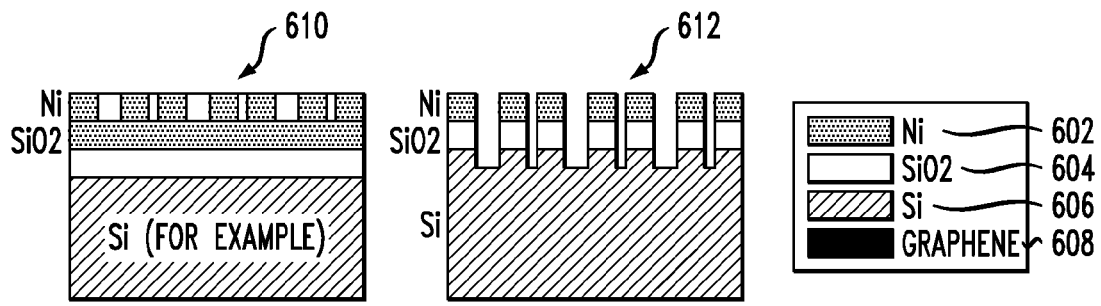
FIG. 6 is a diagram illustrating two examples of patterned metal templates that may be used and reused to form patterned graphene layers, according to an embodiment of the present invention.

FIG. 6 is a diagram illustrating two examples of patterned metal templates that may be used and reused to form patterned graphene layers, according to an embodiment of the present invention. Such templates may be useful in cases where the desired metal patterns cannot easily be formed by self-assembly techniques, making it costly to fabricate a new patterned metal layer each time an individual graphene layer is to be patterned. By way of illustration, 610 in FIG. 6 depicts a planar template that includes an array of Ni patterns embedded in a dielectric on a base substrate, and 612 in FIG. 6 depicts a non-planar stamp-like template that includes an array of Ni patterns extending above a base substrate. As shown, FIG. 6, FIG. 7 and FIG. 8 depict Ni 602, $SiO_2$ 604, Si 606 and graphene 608.

Figure 7:
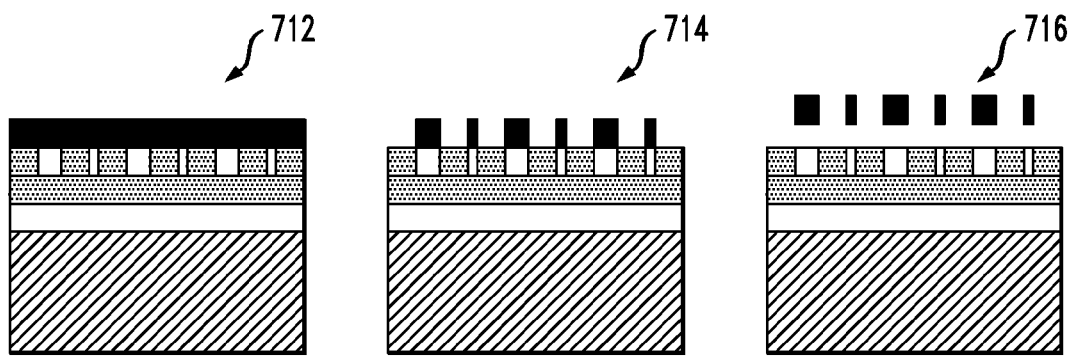
FIG. 7 is a diagram illustrating a first use of a patterned metal template for forming a patterned graphene layer, according to an embodiment of the present invention.

FIG. 7 is a diagram illustrating how patterned metal template 610 of FIG. 6 may be used in a first method to form a patterned graphene layer, according to an embodiment of the present invention. By way of illustration, FIG. 7 depicts a graphene layer being applied to the template of Ni-like structures and removed after patterning. Specifically, in the FIG. 7 example, illustrated step 712 includes applying graphene to the template. Illustrated step 714 includes patterning the graphene via a localized reaction with the Ni. Further, illustrated step 716 includes removing (for example, peeling off) the graphene nanomesh.

Figure 8:
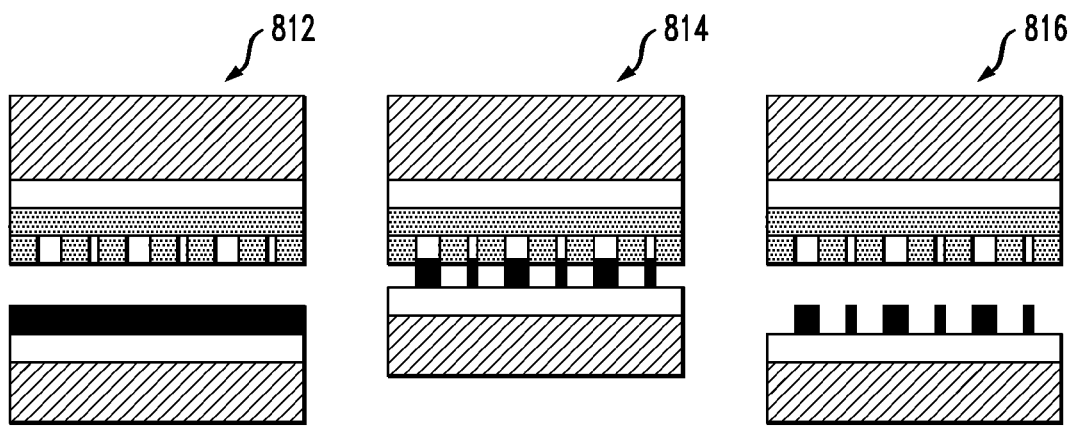
FIG. 8 is a diagram illustrating a second use of a patterned metal template for forming a patterned graphene layer, according to an embodiment of the present invention.

FIG. 8 is a diagram illustrating how patterned metal template 610 of FIG. 6 may be used in a second method to form a patterned graphene layer, according to an embodiment of the present invention. By way of illustration, FIG. 8 depicts the template being applied to a supported graphene layer and removed after patterning. Specifically, in the FIG. 8 example, illustrated step 812 includes applying patterned metal template 610 to the graphene layer. Illustrated step 814 includes patterning the graphene via a localized reaction with the Ni. Further, illustrated step 816 includes removing the template.

In both the example of FIG. 7 and the example of FIG. 8, the template may be refurbished after use by annealing, for example, in $Ar/H_2$ at approximately 800 degrees Celsius, to remove any dissolved carbon.

The process used to remove the patterned structure of a carbide-forming metal or metal-containing alloy after the graphene patterning reaction will depend on the form and composition of the patterned metal structure. Template structures such as those shown in FIGS. 6-8 may be removed by mechanical separation. More commonly, the patterned structure of a carbide-forming metal or metal-containing alloy such as those shown in 416 of FIGS. 4 and 516 of FIG. 5 is removed after graphene patterning by performing a wet etch process that etches the patterned structure of a carbide-forming metal or metal-containing alloy selectively to graphene and to the substrate on which the graphene is disposed. For patterned structures of Ni (such as shown in 416 of FIGS. 4 and 516 of FIG. 5), etchants can include aqueous solutions of HCl, $FeCl_3$, aqua regia, or commercial etchants such as Transene Thin Film Nickel Etchant TFB, Transene Thin Film Nickel Etchant TFG, or Transene Nickel Etchant Type I.

As detailed herein, Ni-like structures may be patterned lithographically, by deposition or etching through a mask. However, in a preferred embodiment of the present invention, lithography is avoided and the Ni-like structures are self-assembled. Self-assembly of Ni-like structures can be accomplished, for example, by deposition of preformed Ni-like nanoparticles from solution (by spraying, spinning, dip coat, etc.), where preformed nanoparticles may further include surface layers of additional materials that are not Ni-like (for example, functionalizing molecules to facilitate suspension in solution).

For self-assembly of nickel nanoparticles on graphene or oxide surfaces, the nanoparticles can be coated with a bifunctional group which at one end forms a covalent bond with the nanoparticle and at the other end has a functionality which can form an electrostatic or covalent bond with a graphene or oxide surface. For example, for self-assembly of nickel nanoparrticles on graphene surface, nanoparticles may be reacted with bifunctional compounds having a thiol (—SH) group on one end (to form a bond with the nanoparticle) and a functionality such as a diazonium salt (—$N_2^+X^-$, where $X^-$ is an inorganic or organic anion such as a halogen) on the other end (to allow charge transfer bonding to graphene).

For self-assembly on oxide surfaces, especially on metal oxide surfaces, the nanoparticles can be again coated with bifunctional molecules having a thiol group at one end. However, the other end of the bifunctional molecule can include a phosphonic acid (—$PO(OH)_2$) group to help the nanoparticle form a covalent bond to the metal oxide (hafnium oxide, aluminum oxide, etc.), resulting in self-assembly of nanoparticles on the oxide surface.

Alternatively, self-assembly of Ni-like structures can be accomplished by the blanket deposition of a thin (1-30 nanometers (nm) layer) film Ni-like layer followed by annealing at an elevated temperature in an environment to agglomerate the thin film into nanodots. Nanodot size and spacing may be controlled by Ni film thickness (typically smaller and more closely spaced dots for thinner Ni films), annealing conditions (temperature and gas environment), and the wetting properties of the surface on which the Ni film is deposited. For example, Ni nanodot formation on Si substrates can include coating with 10-20 nm of $SiO_2$ by depositing 3-20 nm Ni and annealing at 850 degrees Celsius in $N_2$ for times of 20-30 seconds. Other methods of metal nanodot formation include, for example, a plasma-assisted Ni nanoparticle formation process developed by, in which Ni is slowly sputtered onto substrates exposed to a plasma.

As detailed herein, graphene patterning via a localized reaction with Ni-like materials occurs at elevated temperatures in an environment by such mechanisms as metal-catalyzed decomposition into carbon-containing volatiles (typically in a hydrogen-containing environment) and/or reaction and/or complexation with Ni-like materials to form solublized carbon and/or carbides. Environments may include, for example, a vacuum, gases such as Ar, $N_2$, He, $H_2$, and mixtures of these gases. Temperatures in the range 500-1000 degrees Celsius, and preferably in the range 600-800 degrees Celsius may be employed for times ranging from a few hours for temperatures at the low end of the range to a few seconds for temperatures at the high end of the range. Hydrogen containing environments may be preferable because they facilitate the production of carbon-containing volatiles that are more completely removed from the reaction area than carbon remaining in the metal nanodot.

Figure 9:
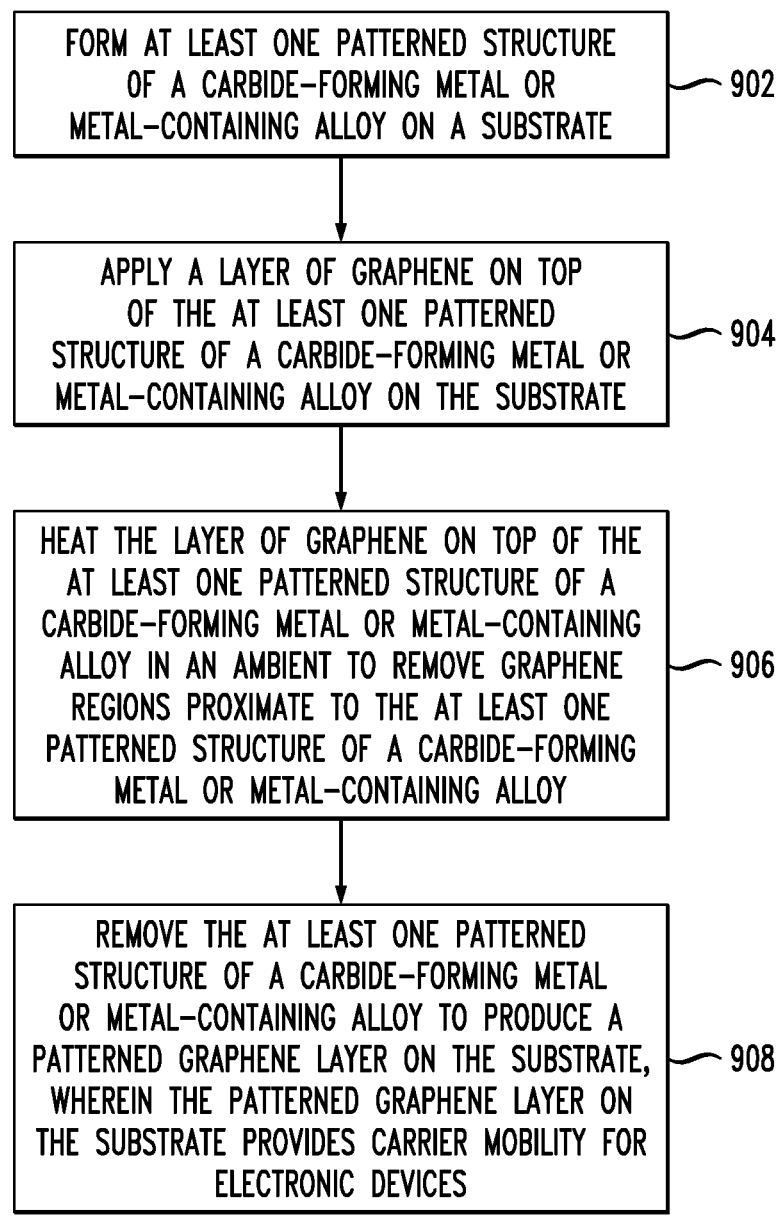
FIG. 9 is a flow diagram illustrating techniques for forming a patterned graphene layer on a substrate, according to an embodiment of the present invention.

FIG. 9 is a flow diagram illustrating techniques for forming a patterned graphene layer on a substrate (for example, an insulating substrate), according to an embodiment of the present invention. Step 902 includes forming at least one patterned structure of a carbide-forming metal or metal-containing alloy on a substrate. An array of Ni nanodots would be an example of a patterned carbide-forming metal or metal-containing alloy structure. Arrays of metal nanodots may be formed by applying a liquid suspension of nanodots and drying, or by forming a thin (for example, 1-10 nm) film of a metal and gently heating it up so that it breaks up into metal dots.

The patterned structure of a carbide-forming metal or metal-containing alloy can be patterned lithographically by deposition or etching through a mask. Further, the patterned structure of a carbide-forming metal or metal-containing alloy can include material selected from a group containing Ni, Fe, Co, Pt, and an alloy of a combination thereof.

Also, the patterned structure of a carbide-forming metal or metal-containing alloy can be self-assembled. Self-assembly of the patterned structure of a carbide-forming metal or metal-containing alloy can include deposition of multiple preformed carbide-forming metal or metal-containing alloy nanoparticles from solution, for example, by spraying, spinning, dip coat, etc.

Preformed carbide-forming metal or metal-containing alloy nanoparticles can include at least one surface layer of additional material that is not carbide-forming metal or metal-containing alloy. By way of example, this can include functionalizing molecules to facilitate suspension in solution. Additionally, self-assembly of the at least one patterned structure of a carbide-forming metal or metal-containing alloy can include blanket deposition of a film of a carbide-forming metal or metal-containing alloy layer, and annealing the film at an elevated temperature in an environment to agglomerate the film into multiple nanodots. In such an embodiment, the film of a carbide-forming metal or metal-containing alloy layer can include a film in a range of approximately one nanometer to approximately 30 nanometers.

Step 904 includes applying a layer of graphene on top of the at least one patterned structure of a carbide-forming metal or metal-containing alloy on the substrate. Step 906 includes heating the layer of graphene on top of the at least one patterned structure of a carbide-forming metal or metal-containing alloy in an environment to remove graphene regions proximate to the at least one patterned structure of a carbide-forming metal or metal-containing alloy.

Step 908 includes removing the at least one patterned structure of a carbide-forming metal or metal-containing alloy (and/or their residues) to produce a patterned graphene layer on the substrate, wherein the patterned graphene layer on the substrate provides carrier mobility for electronic devices. Removing the patterned structure of a carbide-forming metal or metal-containing alloy to produce a patterned graphene layer on the insulating substrate can include performing a wet etch process that etches the patterned structure of a carbide-forming metal or metal-containing alloy selectively to graphene and to the substrate on which the graphene is disposed.

The techniques depicted in FIG. 9 can also include selecting a substrate.

Figure 10:
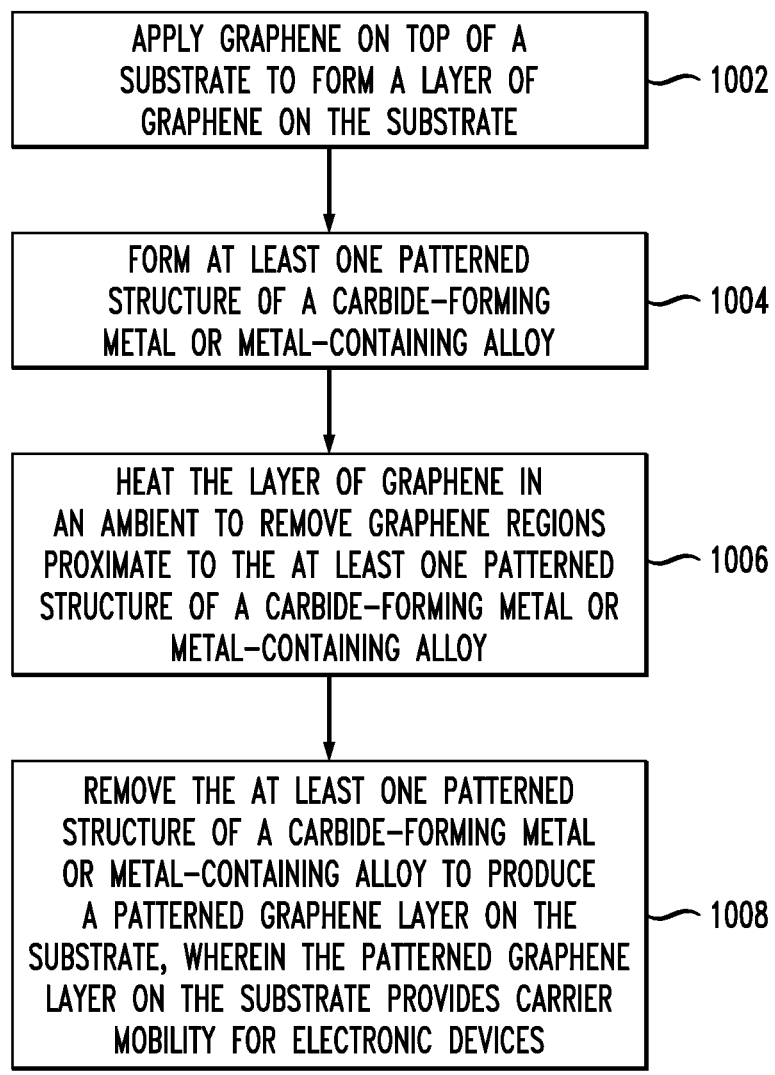
FIG. 10 is a flow diagram illustrating techniques for forming a patterned graphene layer on a substrate, according to an embodiment of the present invention.

FIG. 10 is a flow diagram illustrating techniques for forming a patterned graphene layer on a substrate (for example, an insulating substrate), according to an embodiment of the present invention. Step 1002 includes applying graphene on top of a substrate to form a layer of graphene on the substrate. In an example embodiment, the substrate includes a Cu-containing layer positioned under the layer of graphene.

Step 1004 includes forming at least one patterned structure of a carbide-forming metal or metal-containing alloy. In an example embodiment, a mixed material layer including at least one patterned structure of a carbide-forming metal or metal-containing alloy can further include a graphene layer on the insulating substrate in contact with at least one patterned structure of a carbide-forming metal or metal-containing alloy disposed on a second substrate. Such an aspect can be carried out via use of a patterned Ni (or carbide-forming metal or metal-containing alloy) stamp.

The techniques depicted in FIG. 10 include a substrate that can be dielectric or a non-carbide forming metal.

As also detailed above in connection with the techniques of FIG. 9, the patterned Ni-like structure can be patterned lithographically by deposition or etching through a mask. Further, the patterned structure of a carbide-forming metal or metal-containing alloy can include material selected from a group containing Ni, Fe, Co, Pt, and an alloy of a combination thereof.

Also, the patterned structure of a carbide-forming metal or metal-containing alloy can be self-assembled. Self-assembly of the patterned structure of a carbide-forming metal or metal-containing alloy can include deposition of multiple preformed carbide-forming metal or metal-containing alloy nanoparticles from solution, for example, by spraying, spinning, dip coat, etc. Preformed carbide-forming metal or metal-containing alloy nanoparticles can include at least one surface layer of additional material that is not carbide-forming metal or metal-containing alloy. By way of example, this can include functionalizing molecules to facilitate suspension in solution.

Additionally, self-assembly of the at least one patterned structure of a carbide-forming metal or metal-containing alloy can include blanket deposition of a film of an carbide-forming metal or metal-containing alloy layer, and annealing the film at an elevated temperature in an environment to agglomerate the film into multiple nanodots.

In such an embodiment, the film of a carbide-forming metal or metal-containing alloy layer can include a film in a range of approximately one nanometer to approximately 30 nanometers.

Step 1006 includes heating the layer of graphene in an environment to remove graphene regions proximate to the at least one patterned structure of a carbide-forming metal or metal-containing alloy.

Step 1008 includes removing the at least one patterned structure of a carbide-forming metal or metal-containing alloy to produce a patterned graphene layer on the substrate, wherein the patterned graphene layer on the substrate provides carrier mobility for electronic devices. Removing the patterned structure of a carbide-forming metal or metal-containing alloy to produce a patterned graphene layer on the insulating substrate can include performing a wet etch process that etches the patterned structure of a carbide-forming metal or metal-containing alloy selectively to graphene and to the substrate on which the graphene is disposed.

The techniques depicted in FIG. 10 can additionally include the substrate containing an insulating overlayer. By way of example, a substrate with insulating overlayer includes $Si/SiO_2$.

Additionally, as detailed herein, embodiments of the invention include a graphene nanomesh structure formed with patterned structures of carbide-forming metal or metal-containing alloy materials either under or on top of a layer of graphene.

By way of example, in an embodiment of the invention, a graphene nanomesh structure on a substrate, wherein the graphene nanomesh structure provides carrier mobility for electronic devices, includes a temporary patterned structure of a carbide-forming metal or metal-containing alloy disposed on top of the substrate, and graphene disposed on top of the substrate, wherein the graphene has reacted with the at least one temporary patterned structure of a carbide-forming metal or metal-containing alloy to remove graphene regions proximate to the at least one patterned structure of a carbide-forming metal or metal-containing alloy to produce a graphene nanomesh structure on the substrate.

Additionally, in another embodiment of the invention, a patterned graphene structure on a substrate, wherein the patterned graphene structure provides carrier mobility for electronic devices, includes a temporary patterned structure of a carbide-forming metal or metal-containing alloy disposed on top of the substrate, and graphene disposed on top of the substrate, wherein the graphene has reacted with the at least one temporary patterned structure of a carbide-forming metal or metal-containing alloy to remove graphene regions proximate to the at least one patterned structure of a carbide-forming metal or metal-containing alloy to produce a patterned graphene layer on the substrate.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for forming a patterned graphene layer on a substrate, comprising:
   forming at least one patterned structure of a carbide-forming metal or metal-containing alloy on a substrate;
   applying a layer of graphene on top of the at least one patterned structure of a carbide-forming metal or metal-containing alloy on the substrate;
   heating the layer of graphene on top of the at least one patterned structure of a carbide-forming metal or metal-containing alloy in an environment to remove graphene regions proximate to the at least one patterned structure of a carbide-forming metal or metal-containing alloy; and
   removing the at least one patterned structure of a carbide-forming metal or metal-containing alloy to produce a patterned graphene layer on the substrate, wherein the patterned graphene layer on the substrate provides carrier mobility for electronic devices.

2. The method of claim 1, wherein the substrate comprises an insulating substrate.

3. The method of claim 1, wherein the substrate includes an insulating overlayer.

4. The method of claim 1, wherein the at least one patterned structure of a carbide-forming metal or metal-containing alloy is self-assembled.

5. The method of claim 4, wherein self-assembly of the at least one patterned structure of a carbide-forming metal or metal-containing alloy comprises deposition of multiple preformed carbide-forming metal or metal-containing alloy nanoparticles from solution.

6. The method of claim 5, wherein preformed carbide-forming metal or metal-containing alloy nanoparticles include at least one surface layer of additional material that is not carbide-forming metal or metal-containing alloy.

7. The method of claim 4, wherein self-assembly of the at least one patterned structure of a carbide-forming metal or metal-containing alloy comprises:
   blanket deposition of a film of a carbide-forming metal or metal-containing alloy layer; and
   annealing the film at an elevated temperature in an environment to agglomerate the film into multiple nanodots.

8. The method of claim 7, wherein the film of a carbide-forming metal or metal-containing alloy layer comprises a film in a range of approximately one nanometer to approximately 30 nanometers.

9. The method of claim 1, wherein the at least one patterned structure of a carbide-forming metal or metal-containing alloy is patterned lithographically by deposition or etching through a mask.

10. The method of claim 1, wherein the at least one patterned structure of a carbide-forming metal or metal-containing alloy comprises material selected from a group containing Ni, Fe, Co, Pt, and an alloy of a combination thereof.

11. The method of claim 1, wherein removing the at least one patterned structure of a carbide-forming metal or metal-containing alloy to produce a patterned graphene layer on the substrate comprises performing a wet etch process that etches the at least one patterned structure of a carbide-forming metal or metal-containing alloy selectively to graphene and to the substrate on which the graphene is disposed.

12. A method for forming a patterned graphene layer on a substrate, comprising:
   applying graphene on top of a substrate to form a layer of graphene on the substrate;
   forming at least one patterned structure of a carbide-forming metal or metal-containing alloy;
   heating the layer of graphene in an environment to remove graphene regions proximate to the at least one patterned structure of a carbide-forming metal or metal-containing alloy; and
   removing the at least one patterned structure of a carbide-forming metal or metal-containing alloy to produce a patterned graphene layer on the substrate, wherein the patterned graphene layer on the substrate provides carrier mobility for electronic devices.

13. The method of claim 12, wherein the substrate comprises a Cu-containing layer positioned under the layer of graphene.

14. The method of claim 12, wherein the substrate comprises an insulating substrate.

15. The method of claim 12, wherein the substrate includes an insulating overlayer.

16. The method of claim 12, wherein the at least one patterned structure of a carbide-forming metal or metal-containing alloy is self-assembled.

17. The method of claim 16, wherein self-assembly of the at least one patterned structure of a carbide-forming metal or metal-containing alloy comprises deposition of multiple preformed carbide-forming or metal-containing alloy nanoparticles from solution.

18. The method of claim 17, wherein preformed carbide-forming or metal-containing alloy nanoparticles include at least one surface layer of additional material that is not carbide-forming or metal-containing alloy.

19. The method of claim 16, wherein self-assembly of the at least one patterned structure of a carbide-forming metal or metal-containing alloy comprises:
   blanket deposition of a film of a carbide-forming or metal-containing alloy layer; and
   annealing the film at an elevated temperature in an environment to agglomerate the film into multiple nanodots.

20. The method of claim 19, wherein the film of a carbide-forming or metal-containing alloy layer comprises a film in a range of approximately one nanometer to approximately 30 nanometers.

21. The method of claim 12, wherein the at least one patterned structure of a carbide-forming metal or metal-containing alloy is patterned lithographically by deposition or etching through a mask.

22. The method of claim 12, wherein the at least one patterned structure of a carbide-forming metal or metal-containing alloy comprises material selected from a group containing Ni, Fe, Co, Pt, and an alloy of a combination thereof.

23. The method of claim 12, wherein removing the at least one patterned structure of a carbide-forming metal or metal-containing alloy to produce a patterned graphene layer on the substrate comprises performing a wet etch process that etches the at least one patterned structure of a carbide-forming metal or metal-containing alloy selectively to graphene and to the substrate on which the graphene is disposed.

* * * * *